United States Patent
Chandra

(10) Patent No.: US 9,476,115 B2
(45) Date of Patent: Oct. 25, 2016

(54) MULTILAYER SOLAR SELECTIVE COATING FOR HIGH TEMPERATURE SOLAR THERMAL APPLICATIONS

(71) Applicant: Council of Scientific & Industrial Research, New Dehli (IN)

(72) Inventor: Barshilia Harish Chandra, Bangalore (IN)

(73) Assignee: Council of Scientific & Industrial Research, New Delhi (IN)

( * ) Notice: Subject to any disclaimer, the term of this patent is extended or adjusted under 35 U.S.C. 154(b) by 0 days.

(21) Appl. No.: 14/820,104

(22) Filed: Aug. 6, 2015

(65) Prior Publication Data

US 2016/0040912 A1 Feb. 11, 2016

(30) Foreign Application Priority Data

Aug. 6, 2014 (IN) .......................... 2226/DEL/2014

(51) Int. Cl.
| | |
|---|---|
| B32B 15/04 | (2006.01) |
| C23C 14/06 | (2006.01) |
| C23C 14/02 | (2006.01) |
| H01J 37/34 | (2006.01) |
| F24J 2/46 | (2006.01) |
| F24J 2/48 | (2006.01) |
| C23C 14/08 | (2006.01) |
| C23C 14/16 | (2006.01) |
| C23C 14/58 | (2006.01) |

(52) U.S. Cl.
CPC ......... *C23C 14/0688* (2013.01); *C23C 14/022* (2013.01); *C23C 14/0641* (2013.01); *C23C 14/0676* (2013.01); *C23C 14/08* (2013.01); *C23C 14/165* (2013.01); *C23C 14/5806* (2013.01); *F24J 2/4652* (2013.01); *F24J 2/485* (2013.01); *H01J 37/3405* (2013.01); *H01J 37/3467* (2013.01); *Y02E 10/40* (2013.01)

(58) Field of Classification Search
USPC ....... 428/426, 428, 432, 434, 688, 689, 697, 428/698, 699, 701, 702
See application file for complete search history.

(56) References Cited

U.S. PATENT DOCUMENTS

| | | | | |
|---|---|---|---|---|
| 2004/0241490 | A1* | 12/2004 | Finley ................. | C03C 17/3411 428/655 |
| 2005/0258030 | A1* | 11/2005 | Finley ..................... | C03C 17/09 204/192.26 |
| 2007/0196670 | A1* | 8/2007 | Barshilia ............... | C23C 14/568 428/446 |
| 2010/0313875 | A1* | 12/2010 | Kennedy .................. | F24J 2/055 126/652 |
| 2011/0249326 | A1* | 10/2011 | Villuendas Yuste ..... | F24J 2/485 359/360 |
| 2012/0270023 | A1* | 10/2012 | Templin ............... | G02B 5/0858 428/216 |
| 2014/0178637 | A1* | 6/2014 | Rajagopalan ......... | C23C 28/044 428/141 |
| 2014/0329073 | A1* | 11/2014 | Barshilia ............... | C23C 14/021 428/216 |
| 2016/0003498 | A1* | 1/2016 | Kusiaku ................. | F24J 2/4612 428/216 |
| 2016/0040912 | A1* | 2/2016 | Chandra ............... | C23C 14/022 428/216 |

* cited by examiner

*Primary Examiner* — Lauren R Colgan
(74) *Attorney, Agent, or Firm* — Patterson Thuente Pedersen, P.A.

(57) ABSTRACT

A multilayer solar selective coating on metallic and non-metallic substrates suitable for high temperature solar thermal power applications. The optimized solar selective coating of the present invention on stainless steel substrate exhibits absorptance of 0.954 and emittance of 0.07. A five layer coating is deposited using the sputtering process, and includes tungsten (W), titanium aluminum nitride (TiAlN), titanium aluminum silicon nitride (TiAlSiN), titanium aluminum silicon oxy-nitride (TiAlSiON), and titanium aluminum silicon oxide (TiAlSiO) layers. The first layer (W) acts an infrared reflector, the second layer (TiAlN), the third layer (TiAlSiN) and the fourth layer (TiAlSiON) act as the absorber layer and the fifth layer (TiAlSiO) acts as the anti-reflection layer. The high-temperature solar selective coating exhibits average emittance of 0.10 at 400° C. on stainless steel substrate in the wavelength range of 2.5-25 μm, thus is suitable for applications in concentrating collectors like evacuated receiver tubes for solar thermal power generation.

10 Claims, No Drawings

MULTILAYER SOLAR SELECTIVE COATING FOR HIGH TEMPERATURE SOLAR THERMAL APPLICATIONS

RELATED APPLICATION

The present application claims priority to Indian Application No. 2226/DEL/2014 filed Aug. 6, 2014, which is hereby incorporated herein in its entirety by reference.

TECHNICAL FIELD

The present invention relates to an improved multilayer solar selective coating having very high spectral selectivity useful for high temperature solar thermal applications. Particularly, the present invention provides a multilayer solar selective coating on metallic and non-metallic substrates, preferably on stainless steel 304 (SS304) substrates with absorptance (a) greater than 0.950, emittance ($\in$) less than 0.08 with high solar selectivity in the order of 9-14 and high thermal stability in vacuum (up to 600° C.).

More particularly, the present invention relates to tandem stack multilayer coating of tungsten (W), titanium aluminum nitride (TiAlN), titanium aluminum silicon nitride (TiAlSiN), titanium aluminum silicon oxy-nitride (TiAl-SiON) and titanium aluminum silicon oxide (TiAlSiO) coated on metal and non-metal substrates, more preferably on stainless steel 304 substrates.

BACKGROUND ART

Solar selective coatings having high solar absorptance in the solar spectrum and low thermal emittance at elevated temperatures with enhanced thermal stability (>400° C.) are needed on solar collector receiver tubes to increase the overall solar to electric efficiency of parabolic trough solar power plants [C. Kennedy and H. Price, Proceedings of ISEC2005, 2005, International Solar Energy Conference, August 6-12, Orlando, Fla., USA]. Increasing the operating temperature of the receiver tube reduces the cost of parabolic trough technology and hence the cost of solar electricity.

A large number of high-temperature solar selective coatings have been developed in the recent past for high temperature applications using a combination of high temperature stable materials. Cermets based on Mo—$SiO_2$ [S. Esposito et al., Thin Solid Films 517 (2009) 6000], W—$Al_2O_3$ [A. Berghaus et al., Solar Energy Materials & Solar Cells 54 (1998) 19, A. Antonaia, Solar Energy Materials & Solar Cells 94 (2010) 1604], Mo—$Al_2O_3$ [D. Xinkang et al., Thin Solid Films 516 (2008) 3971] and multilayer absorber consisting compounds of Ti, Al, Si, etc., [H. Lei et al., Chinese Science Bulletin 54 (2009) 1451, Du M. et al., Solar Energy Materials & Solar Cells 95 (2011) 1193].

Reference may be made to applicant's U.S. Pat. No. 7,585,568 and also to international patent application WO 2009/051595 A1, wherein efforts have been made to improve the thermal stability of the absorber coatings. Coatings disclosed therein are thermally stable at approximately 450° C. However, even today there is great challenge to develop solar selective coatings that have high solar absorptance and low thermal emittance for temperatures greater than 400° C. in vacuum/air.

Earlier, the applicant had developed high temperature solar selective coatings for solar thermal power generation and patent applications (3655 DEL 2011, PCT/IN 2012/000451 and 0371DEL2013) are under process. Patent application 3655 DEL 2011 discloses a multilayer solar absorber coating containing tandem stacks of Ti/chrome interlayer, AlTiN, AlTiON and ATiO deposited on SS 304 and other substrates, and exhibits absorptance of 0.930 and emittance of 0.16-0.17 with a thermal stability of 450° C. in vacuum. The chrome layer in this invention was deposited using electrodeposition, whereas the other absorber layers were deposited using sputtering technique. In the second invention (Indian patent application 0371DEL2013 & PCT/IN 2012/000451) the applicant had developed an improved hybrid solar absorber coating using sputtering and sol-gel techniques. This hybrid multilayer absorber coating exhibits absorptance of 0.950, emittance of 0.11 and thermal stability up to 600° C. in vacuum. The above referenced inventions of the applicant had two major limitations: (1) The lowest emittance was 0.11 on stainless steel substrates and (2) the inventions used more than one deposition process (for example, a combination of sputtering, electrodeposition and sol-gel). These limitations of the earlier inventions inspired the inventors to develop an improved high temperature solar selective coating with very low thermal emittance using a sputtering process.

Recently published references related to the improvement in solar selective coatings, are discussed below.

References may be made to B. Weber et al., Structure and Reactivity of Surfaces, Editors C. Morterra et al., Elsevier Science Publishers, B.V. Amsterdam page 919 (1989), wherein optical emissivity during the first stage of the oxidation of W has been studied. A significant increase in the emissivity of W in the temperature range 800-1000 K has been observed because of the formation of $WO_3$.

References may also be made to A. Antonaia, Solar Energy Materials & Solar Cells 94 (2010) 1604, wherein W—$Al_2O_3$ cermet based solar coatings for receiver tube applications have been developed. These coatings display solar absorptance of 0.93 and hemi-spherical emittance of 0.14 at 550° C. and were found to be stable up to 30 days after annealing at 580° C.

References may be made to S. Esposito et al., Thin Solid Films 517 (2009) 6000, wherein Mo/Mo—$SiO_2$ multilayer graded cermet coating has been developed for high-temperature applications. The graded multilayer cermet coating shows solar absorptance of 0.94 and low thermal emittance at high temperature (<0.13 at 580° C.).

References may be made to Du M. et al., Solar Energy Materials & Solar Cells 95 (2011) 1193, wherein $Ti_{0.5}Al_{0.5}N/Ti_{0.25}Al_{0.75}N/AlN$ coatings on copper coated silicon substrates have been developed for solar selective applications. The optimized coatings exhibited absorptance of 0.945 and emittance of 0.04 at 82° C. However, no thermal aging tests have been carried out in this paper.

References may also be made to H. Lei et al., Chinese Science Bulletin 54 (2009) 1451, wherein TiAl/TiAlN/TiAlON/TiAlO coating was deposited on SS and copper substrates using a multi-arc ion plating system. The coating exhibits absorptance of 0.90 and emittance of 0.09-0.19 and is found to be stable in air up to 650° C. for 1 hour. This process uses a multi-arc ion plating system in which it is extremely difficult to control the thicknesses of component layers on a nanometric scale. Also, long term thermal stability tests have not been reported in this paper.

References may be made to C. Sella et al., Solar Energy Materials 16 (1987) 143, wherein low cost selective absorber based on Fe—$Al_2O_3$ cermet film has been deposited on stainless steel substrates. The steel substrate is covered with an infrared reflector consisting of Mo or W. The absorber coating exhibits absorptance of 0.950 and emittance of 0.06. The long term thermal stability tests have not been carried out by these authors. The Fe present in the absorber coating is highly unstable as it forms iron oxide when exposed to air even at room temperature and is not an ideal coating for high temperature applications.

Reference may also be made to U.S. Publication No. US 2011/0249326A1, wherein solar absorber coating consisting of metal, dielectric or ceramic material along with a highly reflective metal layer is manufactured on metallic substrates. For the reflective layer, silver, gold, titanium, chromium, molybdenum, copper, nickel, titanium, niobium, tantalum, tungsten and palladium are used. The absorber layer consists of a multilayer structure consisting of metal and dielectric. The dielectrics are selected from metal oxides and metal element nitrides. The substrate is coated with a Mo layer of 300 nm thickness. On this layer of Mo a multilayer structure consisting of two zones is deposited. The first zone consists of 285 layers of $SiAlO_x$ each having a thickness of 0.08 nm alternated with 285 layers of Mo with a thickness of 0.1 nm. The second zone consists of 390 layers of $SiAlO_x$ with a thickness of 0.08 nm alternated with another 390 layers of Mo with a thickness of 0.06. Over these layers an anti-reflection layer of $SiAlO_x$ has been deposited with a thickness of 87 nm. The coating shows absorptance of 97.5% and emissivity of 15% at 400° C. This invention uses metal layers of thicknesses less than 1 nm for the absorber layer, which may get oxidized when exposed to air. Also, depositing as many as 675 layers each of metal and dielectric makes the process cumbersome. Another disadvantage of this invention is that the emittance is 0.15 at 400° C.

To manufacture an efficient solar absorber coating for solar thermal power generation applications, its absorptance should be as high as possible (>0.950) and the emittance should be as low as possible (<0.10) on thermally stable metallic substrates such as stainless steel. Low emittance of the absorber coating is very much desirable as the radiative losses are proportional to $T^4$, where T is the operating temperature of the receiver tube applications (generally >400° C.). For receiver tubes generally stainless steel is used, which has very high intrinsic emittance (of the order of 0.11-0.12). Therefore, a suitable infrared reflecting layer with improved thermal stability is required for designing a solar selective coating with high spectral selectivity on stainless steel substrates. Additionally, use of the single process (such as sputtering) is necessary for efficient manufacturing of the receiver tubes.

As seen from the prior-art, reducing the thermal emittance of absorber coating on stainless steel alone is a major requirement of efficient solar selective coating. A desired substrate is stainless steel because of its high thermal stability, high corrosion resistance and ease of manufacturability. It is also desired to have high temperature compositionally stabile absorber coatings using a facile manufacturing process and these issues are still relevant even today. Therefore, development of an efficient high-temperature absorber coating using a single process is needed for solar thermal power generation.

W as the infrared reflector, in embodiments of the present invention, is deposited first on a stainless steel substrate using a sputtering process. The W interlayer helps in reducing the overall emissivity of the multilayer absorber coating. Additionally, the other constituent layers of the present invention have been chosen in such a way that the absorber coating exhibits absorptance>0.950, emittance<0.08(at 80° C.) on stainless steel substrates and thermal stability in vacuum up to 600° C. under cyclic heating conditions.

In embodiments of the present invention, the infrared emittance of stainless steel was controlled using a W coating having thickness between 830-1000 nm deposited by a sputtering using a balanced magnetron sputtering system and all the other constituent layers of the tandem stack have been deposited using a four cathode reactive unbalanced pulsed direct current magnetron sputtering technique. The first tungsten layer deposited on substrate decreases the thermal emittance of stainless steel 304 to 0.03-0.04 from its intrinsic emittance of 0.12-0.13. The W coating reduces the emittance of SS 304 to 0.03-0.04 from its intrinsic emittance of 0.11-0.12. The W coated SS 304 substrate was used to deposit high temperature solar selective coating consisting a tandem stack of titanium aluminum nitride, titanium aluminum silicon nitride, titanium aluminum silicon oxy-nitride and titanium aluminum silicon oxide deposited using a four cathode reactive pulsed direct current magnetron sputtering system. The present invention, thus, provides a multilayer solar selective coating having absorptance>0.950, emittance≤0.08 (on SS 304) and high thermal stability in vacuum at 600° C. up to 1000 hours under cyclic heating conditions. The solar selective coating of the present invention is stable up to 350° C. in air for more than 1000 hours under cyclic heating conditions and also displays thermal shock resistance up to 375° C. for more than 100 cycles. The solar selective coating of the present invention displays improved optical properties and thermal stability suitable for high temperature solar thermal power generation

SUMMARY OF THE INVENTION

A main objective of embodiments of the present invention is thus to provide a multilayer solar selective coating on metal and non-metal substrates, more preferably on stainless steel substrates with improved absorptance (>0.950), reduced emittance (≤0.08) and long term thermal stability in vacuum (up to 600° C.) under cyclic heating conditions.

Another objective of embodiments of the present invention is to use W as infrared reflector layer on stainless steel substrate to reduce its emittance to 0.03-0.04 from its intrinsic emittance of 0.11-0.12

Still another objective of embodiments is to provide a W coating on stainless steel substrate with emittance of 0.03 and thermal stability up to 750° C. in vacuum for 3 hours.

Still another objective of embodiments is to provide a multilayer solar selective coating with absorptance>0.950 and emittance of 0.08 on metallic and non-metallic substrates preferably on SS 304.

Still another objective of embodiments is to provide a multilayer coating having very high thermal resistance (up to 600° C. in vacuum under cyclic heating conditions) suitable for parabolic through receiver tubes useful for steam generation.

Still another objective of embodiments is to provide a multilayer solar selective coating on metallic and non-metallic substrates with average emittance of less than 0.10 at 400° C. in the wavelength range of 2.5-25 μm.

Still another objective of embodiments is to provide a multilayer solar selective coating on metallic (preferably on SS304) and non-metallic substrates having solar selectivity ratio in the order of 9-14.

Accordingly, embodiments of the present invention provide an improved multilayer solar selective coating suitable for high temperature solar thermal applications comprising an infrared reflector layer of tungsten (W) being deposited on the substrate followed by deposition of first absorber layer of titanium aluminum nitride (TiAlN), second absorber layer of titanium aluminum silicon nitride (TiAlSiN), a semi-absorber layer of titanium aluminum oxy-nitride (TiAlSiON) and an antireflection layer of titanium aluminum silicon oxide (TiAlSiO) using a sputtering process.

The elements for the deposition of absorber layers and antireflection layer are selected from Ti, Al, Si, N, O and combinations thereof.

In yet another embodiment of the present invention, the elements for the deposition of absorber layers and antireflection layer are selected from Ti, Al, Si, N, O and combinations thereof.

In yet another embodiment of the present invention, the first absorber layer, contains Ti in the range of 25-30 at %, Al in the range of 25-20 at % and N in the range of 40-60 at %.

In yet another embodiment of the present invention, the second absorber layer contains Ti in the range of 20-25 at %, Al in the range of 15-20 at %, Si in the range 5-10 at % and N in the range of 40-60 at %.

In yet another embodiment of the present invention, the semi absorber layer contains Ti in the range of 20-25 at %, Al in the range of 15-20 at %, Si in the range of 8-10 at %, nitrogen in the range of 30-40 at % and O in the range of 20-30 at %.

In yet another embodiment of the present invention, the antireflection layer contains Ti in the range of 20-25 at %, Al in the range of 15-20 at %, Si in the range of 5-10 at % and O in the range of 40-60 at %.

In yet another embodiment of the present invention, the thicknesses of the infrared reflector layer, first, second, third absorber layers are in the ranges of 800-1000 nm, 40-50 nm, 30 nm, 30 nm, and the thickness of anti-reflection layer is in the range of 25-30 nm.

Accordingly, embodiments of the present invention also provide a process for the deposition of multilayer solar selective coating comprising the steps of:
i. metallographic preparation of substrates to reduce surface roughness to <0.10 µm;
ii. chemical cleaning of the substrate;
iii. placing the substrate in a balanced magnetron sputtering system and creating a vacuum of $5.0\times10^{-4}$ Pa;
iv. cleaning of the substrate using Ar plasma with a bias voltage of 600-700 V;
v. depositing W layer at temperature in the range of 25 to 60° C. at a power density of 2.26 to 4.52 W/cm$^2$;
vi. placing the W coated substrate in a four cathode reactive pulsed direct current magnetron sputtering system consisting of two Ti, one Al and one Si targets and to achieve a vacuum of $5.0\times10^{-4}$ Pa;
vii. depositing the first absorber layer (TiAlN) using two titanium and one Al targets at a substrate temperature in the range of 275-350° C., substrate bias in the range of −50 to −150V and nitrogen flow rate in the range of 10-20 sccm;
viii. depositing the second absorber layer (TiAlSiN) using two titanium, one Al and one silicon targets at a substrate temperature in the range of 275 to 350° C., substrate bias in the range of −50 to −150V and nitrogen flow rate in the range of 10-30 sccm;
ix. depositing the third semi-absorber layer (TiAlSiON) using two titanium, one Al and one silicon targets at a substrate temperature in the range of 275-350° C., substrate bias in the range of −50 to −150V, nitrogen flow rate in the range of 10-20 sccm and oxygen flow rate in the range of 2-10 sccm;
x. depositing the anti-reflection layer (TiAlSiO) using two titanium, one Al and one silicon targets at a substrate temperature in the range of 275-350° C. and oxygen flow rate in the range of 5-20 sccm; and
xi. etching the anti-reflection layer in Ar plasma for a duration of 20-40 minutes at a substrate temperature of 250-350° C. and substrate bias in the range of −500 to 1200 V to obtain multilayer solar selective coating.

In yet another embodiment of the present invention, the solar selective coating was deposited at sputtering power density of 2.26-3.96, 1.98-3.96 and 1.13-2.26 W/cm$^2$ for Ti, Al and Si targets, respectively.

In yet another embodiment of the present invention, the vacuum chamber was maintained at the base pressure of $5.0\times10^{-4}$ Pa and operating pressure in the range of 0.1-0.5 Pa.

DETAIL DESCRIPTION OF THE INVENTION

Embodiments of the present invention provide a multi-layer solar selective coating that contains a tandem stack of tungsten (W), aluminum titanium nitride (AlTiN), aluminum titanium silicon nitride (AlTiSiN), aluminum titanium silicon oxy-nitride (AlTiSiON) and aluminum titanium silicon oxide (AlTiSiO) coated on metallic or non-metallic substrates, more importantly on stainless steel 304. The present invention reduces the thermal emittance of stainless steel 304 substrate and also provides a method to prevent outward diffusion of stainless steel to the absorber coatings when operated at higher operating temperatures. W has been chosen because of its very high melting point (3422° C.) and low electrical resistivity (5.5 µΩ-cm). The W coating of the present invention is deposited using a sputtering process. The emittance of the stainless steel substrate after coating W layer having thickness≥800 nm reduces to 0.03-0.04 as against its intrinsic emittance of 0.11-0.12. The solar selective coating, deposited on stainless steel substrate, qualified tape adhesion test. The first and the second layers (TiAlN and TiAlSiN) of embodiments of the present invention act as a main absorber layer, the third layer of embodiments of the present invention (TiAlSiON) acts as a semi-absorber layer and the fourth layer (TiAlSiO) acts as the anti-reflection layer. All the four layers have been deposited using a semi-industrial four cathode reactive pulsed direct current magnetron sputtering system. The target materials of the present invention (Ti, Al, Si) have been chosen in such a way that when they are exposed to air at high operating temperature, they form highly stable oxides such as $TiO_2$, $Al_2O_3$, and $SiO_2$.

The W layer of the solar selective coating of embodiments of the present invention was deposited using a planar magnetron sputtering system. A DC power supply (1.0 kW capacity) was used to sputter W target. The sputtering system comprises a vacuum chamber, turbo molecular pump, rotary pump, 3 magnetron cathodes mounted vertically, 1.0 kW DC power supply for ion bombardment, vacuum gauges and control consoles.

The absorber layers and the anti-reflection layers of embodiments of the present invention were deposited in a four cathode reactive pulsed direct current unbalanced magnetron sputtering system. The sputtering system includes four unbalanced magnetron cathodes mounted horizontally in opposed cathode configuration, four 5.0 kW pulsed DC power supplies, substrate heater, 1.5 kW pulsed DC power supply for bias, turbomolecular pump, vacuum gauges and control consoles.

In order to deposit absorber layers and anti-reflection layer of embodiments of the present invention, two Ti (purity=99.95%), one Al (purity=99.99%) and one Si (purity=99.999%) targets were sputtering in argon plasma containing nitrogen and or oxygen gases (all with 99.99% purity). The diameter of the sputtering targets was 150 mm and the thickness was 12 mm. The absorber coating was prepared at a base vacuum in the range of $3.5 \times 10^{-4}$ Pa and an operating pressure in the range of $1.0-3.0 \times 10^{-1}$ Pa. The flow rates of Ar, $N_2$ and $O_2$ gases were controlled separately by mass flow controllers. All the four layers of the absorber coatings were sputtered using bipolar pulsed DC power supplies with power densities in the range of 0.5-5.0 W/cm². A substrate bias of the order of −50 to −250 V was used to deposit three absorber layers of the solar selective coatings and no bias was used for the deposition of anti-reflection layer. During the deposition the substrate temperature was in the range of 100-350° C.

The coatings were deposited on various metallic and non-metallic substrates. The substrates were polished to remove the oxide impurities as well as to decrease the surface roughness in the range of 0.05-0.15 μm. The polished samples were cleaned in an ultrasonic agitator using acetone and isopropyl alcohol. Cleaned substrates were then kept in a balanced magnetron sputtering system. The chamber was pumped down to a base vacuum of $4.0-6.0 \times 10^{-4}$ Pa. A W layer having thickness in the range of 0.5-1.2 μm was deposited using a DC power supply at room temperature. Before depositing W coating, the substrates were cleaned using Ar plasma for a duration of 20-60 minutes with a substrate bias in the range of −400 to −800 V.

The W coated substrate was then kept in a four cathode reactive pulsed direct current magnetron sputtering system. The sputtering chamber was pumped down to a base vacuum in the range of $4.0-6.0 \times 10^{-4}$ Pa. The substrate was further cleaned in Ar plasma for a duration of 20-40 minutes at a bias voltage in the range of −800 to −1200 V. The first absorber layer was deposited at a substrate temperature in the range of 200-350° C. and a bias voltage in the range of −100 to −250 V using sputtering of two titanium and one aluminum target in Ar+$N_2$ plasma. The second layer was deposited at a substrate temperature in the range of 200-350° C. and at a bias voltage in the range of −100 to −250 V using the sputtering of two titanium, one aluminum and one silicon targets in Ar+$N_2$ plasma. The third absorber layer was deposited at a substrate temperature in the range of 200-350° C. and at a bias voltage in the range of −100 to −250 V using the sputtering of two titanium, one aluminum and one silicon targets in Ar+$N_2$+$O_2$ plasma. The anti-reflection layer was deposited at a substrate temperature in the range of 200-250° C. and at a bias voltage in the range of −100 to −250 V using the sputtering of two titanium, one aluminum and one silicon targets in Ar+$O_2$ plasma. The anti-reflection layer was then etched in Ar+$O_2$ plasma at a temperature in the range of 100-350° C. and substrate bias in the range of −500 to −900 V for a duration of 20-60 minutes to stabilize the microstructure of the top layer of the absorber coating of the present invention. The tandem stack of the IR reflector layer (W), absorber layers (TiAlN and TiAlSiN) semi-absorber layer (TiAlSiON) and anti-reflection layer (TiAlSiO) effectively increased the absorptance and reduced the emittance considerably and also enhanced the thermal stability of the solar selective coating.

The absorptance and emittance of the absorber coatings were measured using a reflectometer and an emissometer. The measurements were carried out at four places and the values reported herein are the average of four measurements. The infrared reflectance was measured using an FTIR instrument. The thermal stability of the coatings was studied by heating the coatings in air (a tubular furnace) and vacuum (a hot plate covered with a shroud) at different temperatures and different durations under cyclic heating conditions. The thickness of the different layers of the absorber coating was evaluated using a field emission scanning electron microscope. The compositions of first, second and third absorber layers and the anti-reflection layers were controlled independently by controlling the sputtering power of Ti, Al and Si targets and also by controlling the flow rates of nitrogen and oxygen gases.

Embodiments of the invention provide an ability to reduce the emittance of the absorber coating on SS 304 (~0.07 at 82° C. and ≤0.10 at 400° C. in air). Another feature of embodiments of the present invention is the use of only a sputtering process to manufacture the efficient solar absorber coating rather than multiple processes thus making the manufacturing process simple and cost effective. By incorporating the above features, embodiments of the present invention provide solar selective coating that is thermally stable up to 600° C. in vacuum under cyclic heating conditions for 1000 hours.

Embodiments of the present invention also provide for the selection of the elements for the infrared reflector layer, absorber layers and anti-reflection layers and their compositions (including the selection of target elements for deposition on substrate). The infrared reflector, W, has been chosen because it has the highest melting point (3422° C.) among the metals. It is stable material when exposed to elevated temperatures with free energy formation ($\Delta H_f$) of 140 kcal/mol [CRC Handbook of Chemistry & Physics, Edt. by R. C. Weast and M. J. Astle (CRC Press Inc., Boca Raton, $63^{rd}$ Edition, 1982)].

TiAlN coatings have been conventionally used in the cutting tool industry because of their higher oxidation resistance (~750-800° C.), high hardness and chemical inertness [W. D. Munz, J. Vac. Sci. Technol. 4 (1986) 2717]. Higher thermal stability of TiAlN has been reported due to the formation of a protective alumina layer (J. L. Endrino, Surf. Coat. Tehnol. 200 (2006) 6840). TiAlN when exposed to air at elevated temperatures promotes rapid diffusion of Al to surface along the grain boundaries, which helps in the formation of an amorphous $Al_2O_3$ layer ($\Delta H_f$=−400 kcal/mol). Addition of Si to TiAlN is known to increase the oxidation resistance/thermal stability (approximately 900° C.) [S. PalDey et al., Mater. Sci. Eng. A 342 (2003) 58]. Addition of Si to TiAlN also stops the grain growth and stimulates re-nucleation of grains, which results in a non columnar morphology.

In embodiments of the present invention, component layers are stacked in such a way that there is a gradient of refractive from the top of the absorber layer to the bottom of the absorber layer, resulting in very high absorptance and low emittance. Additionally, the constituent elements of the absorber layer (i.e., Ti, Al and Si) form stable oxides when sputtered in oxygen plasma. The heats of formation of $TiO_2$ and $SiO_2$ are: −224 and −217 kcal/mol, respectively. Therefore, all the layers of the present invention are thermally stable at higher operating temperature, resulting in improved thermal stability of the absorber coating.

Embodiments of the present invention include the following features:

1. Deposition of a thermally stable W infrared reflector on metallic and non-metallic substrates to reduce thermal emittance to ≤0.04. The W interlayer also acts a diffusion barrier between the substrate and the absorber coating.
2. Designing the constituent layers in such a way that there is a gradient in the refractive indices from top of the coating to the bottom of the coating to achieve maximum absorptance in the solar spectrum region. This gradient was achieved by controlling the electrical conductivities of the constituent layers by varying their composition.
3. Selection of the absorber layers having very high thermal stability, in which the first and the second layers (i.e, TiAlN and TiAlSiN) act as the main absorber layer, the third layer (TiAlSiON) acts as a semi-absorber layer and the fourth layer (TiAlSiO) acts as an anti-reflection layer.

EXAMPLES

The following examples are given by way of illustration and therefore should not be construed to limit the scope of the present invention.

Example 1

Deposition of Solar Selective Coatings on Stainless Steel Substrates

Stainless steel substrates of dimension 35 mm×35 mm were metallographically polished and cleaned using acetone and isopropyl alcohol. The cleaned substrates were put in the vacuum chamber of a planar magnetron sputtering system. The vacuum chamber was pumped down to a base vacuum of $4.0 \times 10^{-4}$ Pa. The substrates were then cleaned in Ar plasma for 30 minutes duration with a substrate bias of −400V. Approximately 830 nm thick W thin film was grown on stainless steel substrate using a DC power supply with a power of 100 W and a deposition time of 12 minutes. The deposition was carried out at zero substrate bias and at a substrate temperature of 40° C. The W coated substrate was placed in a four cathode reactive pulsed direct current unbalanced magnetron sputtering system. The sputtering chamber was pumped down to $5.0 \times 10^{-4}$ Pa. The W coated substrate was further cleaned at 350° C. in Ar plasma for 30 minutes at a bias voltage of −800V. Subsequently, the TiAlN layer was deposited using the sputtering of two Ti and one Al targets in Ar+$N_2$ plasma. The flow rates of Ar and $N_2$ were 28 and 14 sccm, respectively. The second absorber layer TiAlSiN was deposited using sputtering of two Ti, one Al and one Si targets in Ar+$N_2$ plasma. The flow rates of Ar and $N_2$ were: 28 and 16 sccm, respectively. The third absorber layer TiAlSiON was deposited using sputtering of two titanium, one aluminum and one Si targets in Ar+$N_2$+$O_2$ plasma. The flow rates of Ar, $N_2$ and $O_2$ were 18, 12 and 6 sccm, respectively. Finally, the anti-reflection layer was sputtering using two Ti, one Al and one Si targets in Ar+$O_2$ plasma. The flow rates of Ar and $O_2$ were 18 and 12 sccm, respectively. For all the absorber layers a substrates bias of −100 V and a substrate temperature of 325° C. were used, whereas for the anti-reflection layer no substrate bias was used. For all the layers the power densities of Ti, Al and Si targets were 2.82, 3.39, 1.98 W/cm², respectively. The antireflection layer was further etched in Ar+$O_2$ plasma for a duration of 20 minutes at a substrate bias of −800V and substrate temperature of 325° C. to stabilize the microstructure.

The deposition time for the individual layers was as follows:
1. TiAlN: 6.30 minutes
2. TiAlSiN: 6 minutes
3. TiAlSiON: 9 minutes
4. TiAlSiO: 7.30 minutes Using the above process, stainless steel substrate has been coated with solar a selective coating of total thickness 125 nm containing TiAlN layer 40 nm, TiAlSiN layer 30 nm, TiAlSiON layer 30 nm and TiAlSiO layer 25 nm. The absorptance and emittance of the coated sample was measured using a reflectormeter and emissometer from M/s. Devices & Services, USA. The emittance was measured at 82° C. The accuracies for emittance and absorptance values were ±0.002 and ±0.001, respectively. The absorptance and emittance of coated sample is given in Table 1. The coating exhibited absorptance of 0.954 and emittance of 0.07 with solar selectivity of 13.6 on SS304 substrate.

Example 2

In order to judge the dependence of individual layer thicknesses on the absorptance and emittance values of the absorber coating, another sample was coated with solar selective coating using the process outlined in Example 1. All the process parameters were kept constant except the deposition time. Before coating the sample with solar selective coating deposition of W layer was carried out using 3 inches sputtering gun with a power of 100 W and deposition time of 15 min. The thickness of W layer was 1000 nm. The deposition time for individual layers was as follows:
1. TiAlN: 8 minutes
2. TiAlSiN: 6 minutes
3. TiAlSiON: 9 minutes
4. TiAlSiO: 8 minutes The thickness of the coating on the sample was measured with field emission scanning electron microscope and it was observed that coating had a total thickness of 130 nm. The thickness of individual layer was found as below:
1. TiAlN: 49 nm
2. TiAlSiN: 30 nm
3. TiAlSiON: 30 nm
4. TiAlSiO: 27 nm.

The coated sample was subjected to characterization of the optical properties using reflectormeter and emissometer. The absorptance and the emittance of this coated sample were found to be 0.941 and 0.10, respectively with solar selectivity of 9.4.

Example 3

Thermal Stability of W IR Reflector Coated on Stainless Steel Substrate

The tungsten coating with a thickness of 830 nm, as described in Example 1, was prepared on SS 304 and subjected to heat-treatment in air and in vacuum for 3 hours to study the stability of the coating at higher temperature. In the case of air annealing, the heating rate was ±5° C./minutes and the accuracy of the set temperature was ±1° C., whereas, for the vacuum annealing (P=$6.0 \times 10^{-4}$ Pa) the heating rate was ±10° C./minutes and the accuracy of the set temperature was ±5° C. The emittance values of the W coating after heat-treatment in air and vacuum are listed in Table 2. It can be seen from the table that W coating heated in air is stable only up to 350° C. and subsequently the emittance increases drastically essentially due to the formation of $WO_3$ phase as confirmed using X ray diffraction studies. However, there is no change in the emittance values even after annealing up to 750° C. in vacuum.

Example 4

Effect of Heat Treatment in Air on the Optical Properties of the Multilayer Solar Selective Coating Deposited on SS304 Substrate The multilayer stack of the solar selective coating of the present invention as described in Example 1 was heat treated in air for 7 hours duration at different temperatures (450, 500, 550, 600 and 650° C.) in a resistive furnace. The heating and cooling rates were 3° C./minutes and 1° C./minutes. The accuracy of the measurements was ±1° C. The absorptance and emittance values after heat treatment are presented in Table 3, which clearly indicates that the coating is unstable for annealing temperature greater than 500° C. Especially, for temperature greater than 600° C., the absorptance decreases and emittance increases significantly. In order to study the thermal stability of the coatings under prolonged durations, the solar selective coating of the present invention was subjected to heat treatment in air at 400° C. for 1009 under cyclic heating conditions. The absorptance and emittance values were measured intermittently and the same are tabulated in Table 4. It can be seen from the table that the absorptance decreased by 15% and the emittance increased by 36% after heating the coating in air at 400° C. for 1009 hours, indicating instability of the coating at 400° C. for 1009 hours. Subsequently, the heat-treatments were carried at 375° C. in air for 1050 hours under cyclic heating conditions. The absorptance and emittance values after heat treatment are displayed in Table 5. It is clear for on the table that there is no change in the emittance of the coating even after long exposure at 375° C. in air for 1050 hours under cyclic heating conditions, however, the absorptance decreased slightly. The annealing experiments were therefore further carried out at 350° C. and the absorptance and emittance values are listed in Table 6. The data indicates that the coating is stable upon heating in air up to 350° C. for 1000 hours under cyclic heating conditions.

Example 5

Effect of Heat Treatment in Vacuum on the Optical Properties of the Multilayer Solar Selective Coating Deposited on SS304 Substrate The solar selective coating of embodiments of the present invention as described in Example 1 was also subjected to annealing in vacuum ($6.0 \times 10^{-4}$ Pa) at 600° C. for longer durations under cyclic heating conditions. Annealing involved heating the sample at 600° C. with a heating rate of 10° C./minutes, maintaining the desired temperature for 6 hours and cooling the sample at a rate of 4° C./minutes. The accuracy of the temperature measurement was ±5° C. The absorption and emittance values of the samples after heat treatment were measured intermittently and the values are depicted in Table 7. As can be seen there is no change in the absorption value even after heating up to 600° C. for 1000 hours and the emittance increased to 0.10 from 0.07, indicating the stability of the coating up to 600° C. in vacuum.

Example 6

Effect of Thermal Shock Treatment in Air on the Optical Properties of the Multilayer Solar Selective Coating Deposited on SS304 Substrate The solar selective coating of embodiments of the present invention as described in Example 1 was subjected to thermal shock treatments at 375° C. in air. The treatment was carried out in air furnace. The furnace was set at a temperature of 375±5° C. After attaining the desired temperature, the solar selective coating of the present invention was directly placed in the furnace and soaked for 30 minutes, after which the sample was pulled out of the furnace and cooled down to room temperature. The sample was again inserted in the furnace, which was kept at 375° C. The sample was then soaked for 30 minutes and taken out of the furnace, and cooled down to room temperature. This cycle was repeated 100 times. The absorptance and emittance values were measured intermittently and are summarized in Table 8. As can be seen from the table that no significant changes in the absorptance and emittance values were observed even after 100 cycles of thermal shock treatment indicating that coating was structurally stable up to 375° C. in air.

Example 7

Emittance of the Multilayer Solar Selective Coating Deposited on SS304 Substrate at 400° C.

The solar selective coating of embodiments of the present invention as described in Example 1 was also prepared on 12.5 mm diameter stainless steel 304 substrates. These samples were heat-treated in air in a furnace at 400° C. for 1 hour for degassing. Subsequently, the samples were kept in a Bruker, VERTEX 70 FTIR instrument for emittance measurements at 400° C. in the wavelength range of 2.5-25 μm. During these measurements, after attaining the desired temperature (i.e., 400° C.) the sample was soaked for more than 45 minutes so that both the substrate and the solar selective coating started emitting the radiation. The emittance of the sample and that of the black body were measured at 400° C. and the values reported herein are normalized with respect to the emittance of black body at 400° C. These measurements demonstrated that the average emittance of the solar selective coating of the present invention was 0.10 in the wavelength range of 2.5 to 25 μm.

TABLE 1

Absorptance and emittance values of different layers of multilayer solar selective coating of embodiments of the present invention deposited on SS substrates.

| Material | α | ε |
| --- | --- | --- |
| SS | 0.361 | 0.11 |
| SS/W | 0.411 | 0.05 |
| SS/W/TiAlN | 0.676 | 0.06 |
| SS/W/TiAlN/TiAlSiN | 0.808 | 0.06 |
| SS/W/TiAlN/TiAlSiN/TiAlSiON | 0.929 | 0.07 |
| SS/W/TiAlN/TiAlSiN/TiAlSiON/TiAlSiO | 0.954 | 0.07 |

TABLE 2

Effect of annealing in air and vacuum on the emittance of infrared reflector W coating deposited on stainless steel substrate.

| Air | | Vacuum | |
| --- | --- | --- | --- |
| Temperature (° C.) | Emittance | Temperature | Emittance (° C.) |
| 25 | 0.03 | 25 | 0.03 |
| 300 | 0.04 | 400 | 0.03 |
| 350 | 0.05 | 500 | 0.03 |
| 400 | 0.09 | 550 | 0.03 |
| 450 | 0.38 | 600 | 0.03 |
| 500 | 0.52 | 700 | 0.03 |
| 550 | 0.55 | 750 | 0.03 |
| 600 | 0.50 | | |

TABLE 3

Effect of annealing at different temperatures (in air) on optical properties of the SS/W/TiAlN/TiAlSiN/TiAlSiON/TiAlSiO solar selective coating of embodiments of the present invention deposited on SS substrates.

| Temperature (° C.) | Duration (hours) | A | E |
|---|---|---|---|
| As-deposited | — | 0.954 | 0.07 |
| 450 | 7 | 0.946 | 0.07 |
| 500 | 7 | 0.947 | 0.08 |
| 550 | 7 | 0.925 | 0.09 |
| 600 | 7 | 0.786 | 0.27 |
| 650 | 7 | 0.728 | 0.65 |

TABLE 4

Effect of annealing at 400° C. (in air) on optical properties of the SS/W/TiAlN/TiAlSiN/TiAlSiON/TiAlSiO solar selective coating of embodiments of the present invention deposited on SS substrate under cyclic heating conditions.

| Total time of exposure (hours) | α | E |
|---|---|---|
| 0 | 0.958 | 0.07 |
| 7 | 0.954 | 0.08 |
| 100 | 0.950 | 0.08 |
| 275 | 0.933 | 0.09 |
| 510 | 0.855 | 0.11 |
| 577 | 0.885 | 0.11 |
| 1009 | 0.805 | 0.11 |

TABLE 5

Effect of annealing at 375° C. (in air) on optical properties of the SS/W/TiAlN/TiAlSiN/TiAlSiON/TiAlSiO solar selective coating of embodiments of the present invention deposited on SS substrate under cyclic heating conditions.

| Total time of exposure (hours) | α | E |
|---|---|---|
| 0 | 0.954 | 0.08 |
| 250 | 0.945 | 0.08 |
| 350 | 0.939 | 0.08 |
| 410 | 0.930 | 0.08 |
| 500 | 0.928 | 0.08 |
| 835 | 0.894 | 0.08 |
| 1050 | 0.865 | 0.08 |

TABLE 6

Effect of annealing at 350° C. (in air) on optical properties of the SS/W/TiAlN/TiAlSiN/TiAlSiON/TiAlSiO solar selective coating of embodiments of the present invention deposited on SS substrate under cyclic heating conditions.

| Total time of exposure (hours) | α | E |
|---|---|---|
| 0 | 0.954 | 0.07 |
| 188 | 0.945 | 0.07 |
| 428 | 0.945 | 0.07 |
| 600 | 0.942 | 0.07 |
| 763 | 0.935 | 0.07 |
| 980 | 0.924 | 0.07 |
| 1000 | 0.923 | 0.08 |

TABLE 7

Effect of annealing at 600° C. (in vacuum) on optical properties of the SS/W/TiAlN/TiAlSiN/TiAlSiON/TiAlSiO solar selective coating of embodiments of the present invention deposited on SS substrate under cyclic heating conditions.

| Total time of exposure (hours) | A | E |
|---|---|---|
| 0 | 0.956 | 0.07 |
| 57 | 0.950 | 0.09 |
| 105 | 0.950 | 0.09 |
| 125 | 0.950 | 0.09 |
| 159 | 0.950 | 0.09 |
| 203 | 0.950 | 0.09 |
| 255 | 0.947 | 0.09 |
| 274 | 0.947 | 0.09 |
| 306 | 0.947 | 0.10 |
| 352 | 0.946 | 0.10 |
| 409 | 0.945 | 0.10 |
| 450 | 0.945 | 0.10 |
| 500 | 0.944 | 0.10 |
| 550 | 0.944 | 0.10 |
| 650 | 0.944 | 0.10 |
| 800 | 0.945 | 0.10 |
| 880 | 0.945 | 0.10 |
| 1000 | 0.945 | 0.10 |

TABLE 8

Absorptance and emittance data of the SS/W/TiAlN/TiAlSiN/TiAlSiON/TiAlSiO solar selective coating of embodiments of the present invention deposited on stainless steel substrate after thermal shock treatment at 375° C. in air.

| No. of cycles | α | ε |
|---|---|---|
| 0 | 0.950 | 0.07 |
| 16 | 0.949 | 0.07 |
| 69 | 0.949 | 0.08 |
| 82 | 0.949 | 0.08 |
| 100 | 0.949 | 0.08 |

From the examples given herein, it is observed that the solar selective coating of embodiments of the present invention exhibit absorptance of 0.954 and emittance of 0.07 on stainless steel substrate. The coating of embodiments of the present invention is stable in air up to 350° C. for 1000 hours and up to 600° C. in vacuum for 1000 hours under cyclic heating conditions. The solar selective coating of the present invention exhibits an average thermal emittance of 0.10 at 400° C. in the wavelength range of 2.5-25 µm and has passed thermal shock tests at 375° C. in air for 100 cycles. All these optical properties of the solar selective coating of embodiments of the present invention make it a suitable candidate coating for high temperature solar thermal power generation.

Advantages Provided by Embodiments of the Invention

1. Reducing the emittance of the absorber coating on SS 304 to 0.07 at 82° C. and to ≤0.10 at 400° C. in air.
2. Embodiments of the present invention use only a sputtering process to manufacture the efficient solar absorber coating rather than multiple processes, thus establishing the manufacturing process to be simple and cost effective.
3. Embodiments of the present invention provide a multilayer tandem absorber solar selective coating with absorptance of 0.957 and emittance of 0.07 on SS304 substrate, which is stable up to 600° C. in vacuum under cyclic heating conditions, suitable for solar thermal power applications.

The invention claimed is:
1. An improved multilayer solar selective coating suitable for high temperature solar thermal applications comprising an infrared reflector layer of tungsten (W) being deposited on a substrate followed in succession by deposition of a first absorber layer of titanium aluminum nitride (TiAlN), a second absorber layer of titanium aluminum silicon nitride (TiAlSiN), a third semi-absorber layer of titanium aluminum oxy-nitride (TiAlSiON) and an anti-reflection layer of titanium aluminum silicon oxide (TiAlSiO) using a sputtering process.

2. The coating as claimed in claim 1, wherein the elements for the deposition of absorber layers, semi-absorber layer, and antireflection layer are selected from Ti, Al, Si, N, O and combinations thereof.

3. The coating as claimed in claim 1, wherein the first absorber layer contains Ti in the range of 25-30 at %, Al in the range of 25-20 at % and N in the range of 40-60 at %.

4. An improved multilayer solar selective coating as claimed in claim 1, wherein the second absorber layer contains Ti in the range of 20-25 at %, Al in the range of 15-20 at %, Si in the range 5-10 at % and N in the range of 40-60 at %.

5. An improved multilayer solar selective coating as claimed in claim 1, wherein the semi-absorber layer contains Ti in the range of 20-25 at %, Al in the range of 15-20 at %, Si in the range of 8-10 at %, nitrogen in the range of 30-40 at % and O in the range of 20-30 at %.

6. An improved multilayer solar selective coating as claimed in claim 1, wherein the antireflection layer contains Ti in the range of 20-25 at %, Al in the range of 15-20 at %, Si in the range of 5-10 at % and O in the range of 40-60 at %.

7. An improved multilayer solar selective coating as claimed in claim 1, wherein the thicknesses of the infrared reflector layer, first, second, third absorber layers the first absorber layer, the second absorber layer, and the third semi-absorber layer are in the ranges of 800-1000 nm, 40-50 nm, 30 nm, 30 nm and the thickness of the anti-reflection layer is in the range of 25-30 nm.

8. A process for the deposition of a multilayer solar selective coating as claimed in claim 1 comprising the steps of:
   i. metallographic preparation of a substrate to reduce surface roughness to <0.10 μm;
   ii. chemical cleaning of the substrate;
   iii. placing the substrate in a balanced magnetron sputtering system comprising a vacuum chamber and creating a vacuum of $5.0 \times 10^{-4}$ Pa;
   iv. cleaning of the substrate using Ar plasma with a bias voltage of 600-700 V;
   v. depositing a W layer at temperature in the range of 25 to 60° C. at a power density of 2.26 to 4.52 W/cm$^2$;
   vi. placing the W coated substrate in a four cathode reactive pulsed direct current magnetron sputtering system consisting of two Ti, one Al and one Si targets and to achieve a vacuum of $5.0 \times 10^{-4}$ Pa;
   vii. depositing the first absorber layer (TiAlN) using two titanium and one Al targets at a substrate temperature in the range of 275-350° C., substrate bias in the range of −50 to −150V and nitrogen flow rate in the range of 10-20 sccm;
   viii. depositing the second absorber layer (TiAlSiN) using two titanium, one Al and one silicon targets at a substrate temperature in the range of 275 to 350° C., substrate bias in the range of −50 to −150V and nitrogen flow rate in the range of 10-30 sccm;
   ix. depositing the third semi-absorber layer (TiAlSiON) using two titanium, one Al and one silicon targets at a substrate temperature in the range of 275-350° C., substrate bias in the range of −50 to −150V, nitrogen flow rate in the range of 10-20 sccm and oxygen flow rate in the range of 2-10 sccm;
   x. depositing the anti-reflection layer (TiAlSiO) using two titanium, one Al and one Si targets at a substrate temperature in the range of 275-350° C. and oxygen flow rate in the range of 5-20 sccm; and
   xi. etching the anti-reflection layer in Ar plasma for a duration of 20-40 minutes at a substrate temperature of 250-350° C. and substrate bias in the range of −500 to 1200 V to obtain the multilayer solar selective coating.

9. A process as claimed in claim 8, wherein the solar selective coating was deposited at sputtering power density of 2.26-3.96, 1.98-3.96 and 1.13-2.26 W/cm$^2$ for Ti, Al and Si targets, respectively.

10. A process as claimed in claim 8, wherein the vacuum chamber was maintained at the base pressure of $5.0 \times 10^{-4}$ Pa and operating pressure in the range of 0.1-0.5 Pa.

* * * * *